United States Patent
Lang et al.

(10) Patent No.: US 11,881,284 B2
(45) Date of Patent: Jan. 23, 2024

(54) OPEN TRANSLATION UNIT MANAGEMENT USING AN ADAPTIVE READ THRESHOLD

(71) Applicant: Micron Technology, Inc., Boise, ID (US)

(72) Inventors: Murong Lang, San Jose, CA (US); Zhenming Zhou, San Jose, CA (US); Jian Huang, Union City, CA (US); Zhongguang Xu, San Jose, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 17/546,431

(22) Filed: Dec. 9, 2021

(65) Prior Publication Data

US 2023/0186959 A1    Jun. 15, 2023

(51) Int. Cl.
  *G11C 7/10*  (2006.01)
(52) U.S. Cl.
  CPC .................. *G11C 7/1063* (2013.01)
(58) Field of Classification Search
  CPC .............................. G11C 7/1063; G11C 7/10
  USPC .................................................... 365/189.15
  See application file for complete search history.

(56) References Cited

U.S. PATENT DOCUMENTS

| 11,594,297 | B2* | 2/2023 | Di Vincenzo | ........ G11C 7/1006 |
| 2007/0159891 | A1* | 7/2007 | Tu | ........ G11C 29/021 |
| | | | | 365/185.24 |
| 2014/0126294 | A1* | 5/2014 | Yang | ........ G11C 16/26 |
| | | | | 365/185.21 |

* cited by examiner

*Primary Examiner* — Muna A Techane
(74) *Attorney, Agent, or Firm* — Lowenstein Sandler LLP

(57) ABSTRACT

A first read operation is performed on a first set of memory cells addressable by a first wordline (WL), and a second read operation is performed on a second set of memory cells addressable by a second WL, wherein the first set of memory cells and the second set of memory cells are comprised by an open TU of memory cells. A first threshold voltage offset bin associated with the first WL is identified. A second threshold voltage offset bin associated with the second WL is identified. Respective threshold voltage offset bins for each WL of a plurality of WLs coupled to respective sets of memory cells comprised by the open TU are determined based on at least one of the first threshold voltage offset bin and the second threshold voltage offset bin. Respective default threshold voltages for each WL of the plurality of WLs are updated based on the threshold voltage offset bins.

20 Claims, 6 Drawing Sheets

OPEN TRANSLATION UNIT MANAGEMENT USING AN ADAPTIVE READ THRESHOLD

TECHNICAL FIELD

Embodiments of the disclosure relate generally to memory sub-systems, and more specifically, relate to open translation unit management using an adaptive read threshold.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
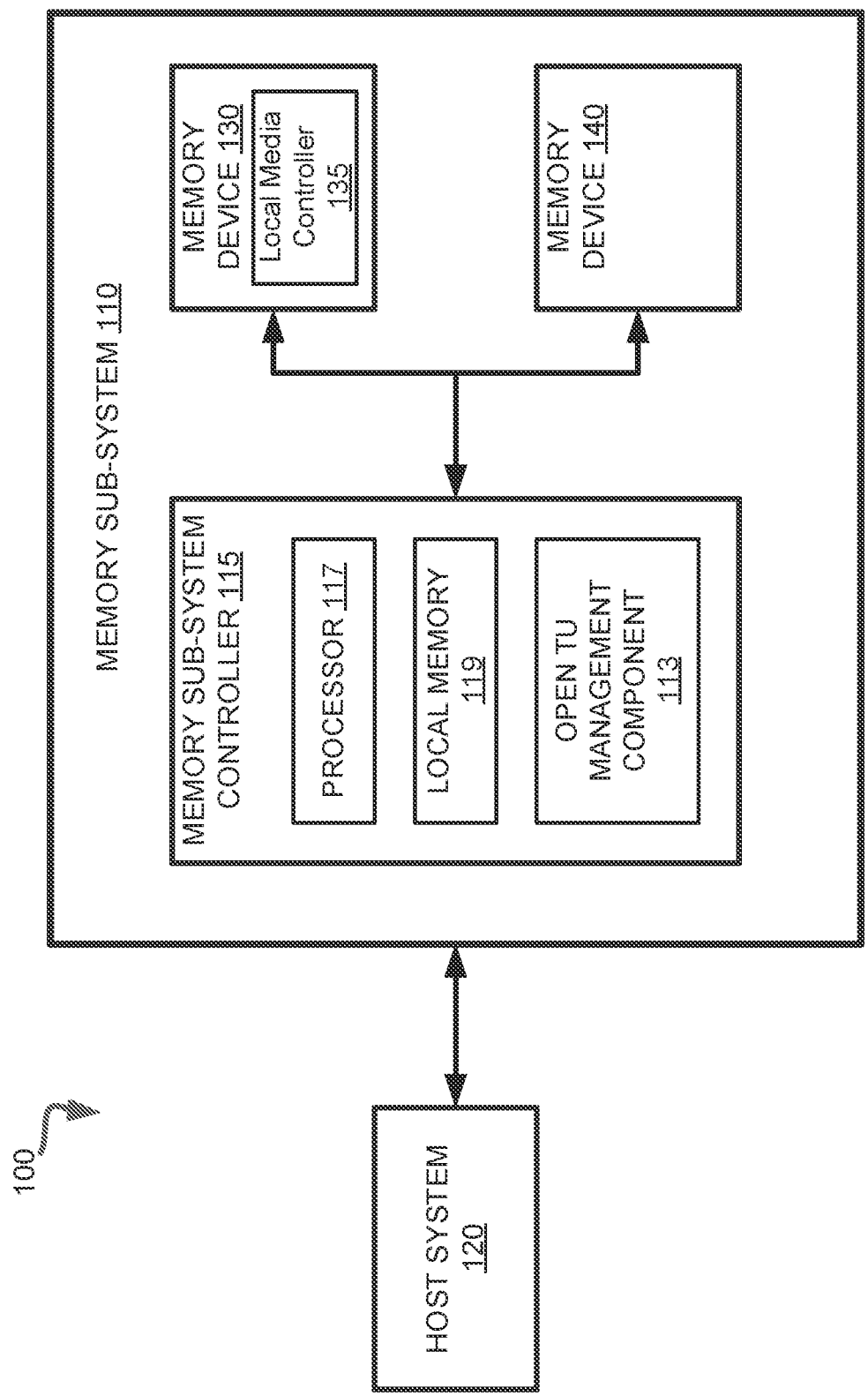
FIG. 1 illustrates an example computing system that includes a memory sub-system in accordance with some embodiments of the present disclosure.

Aspects of the present disclosure are directed to open translation unit management using an adaptive read threshold. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of memory cells arranged in a two-dimensional grid. Memory cells are etched onto a silicon wafer in an array of columns and rows. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ can be applied to a control electrode of the cell to open the cell to the flow of electric current across the cell between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The memory cells can, therefore, be characterized by a distribution P of the threshold voltages, $P(Q, V_T)=dW/dV_T$, where dW represents the probability that any given cell has its threshold voltage within the interval $[V_T, V_T+dV_T]$ when charge Q is placed on the cell.

A memory device can have distributions $P(Q, V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$. The logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

During a read operation of a cell (i.e., a "read cell"), a read voltage level ($V_{read}$) can be applied to an associated wordline, and a sense amplifier connected to an associated bitline can be used to sense whether the read cell has been switched on. If $V_{read}$ is higher than the threshold voltage $V_T$ of the read cell, then the read cell is turned on. It is noted that only one cell per bitline can be read at a time. Since the cells of a bitline are connected in series, all transistors for cells of the bitlines that are not being read ("unread cells") need to be kept on during the read operation in order for the read output of the read cell to pass-through to the sense amplifier. To achieve this, a pass-through voltage ($V_{pass}$) can be applied to the wordlines of the unread cells to keep the unread cells activates (i.e., turned on). More specifically, $V_{pass}$ is a voltage that is chosen to be higher than all of the $V_T$s of the unread cells, but lower than a programming voltage.

One phenomenon observed in memory devices is slow charge loss (SCL), also referred to herein as charge loss, in which $V_T$ distributions shift towards lower voltages as charge diminishes over, e.g., time and/or temperature. That is, SCL and the corresponding $V_T$ distribution shift towards lower voltages can be proportional to the elapsed time from a programming operation to a read operation. As a result, when a read operation has been performed on a cell that has experienced SCL, the cell can have a threshold voltage $V_T$ that is lower than the measured threshold voltage $V_T$ obtained after the cell was programmed. This can require an enlargement of the valleys of the memory device in order to accommodate all possible threshold voltages $V_T$ for a given state and can lead to a higher error rate (i.e., RBER) and read retry rate during subsequent read operations.

Certain memory devices have open translation units (TUs). A TU is a base granularity of data managed by the memory device. A TU can include a predefined number of logical units (e.g., logical pages, logical blocks, etc.). In some examples, a TU is predefined to include one block. In some examples, a TU is predefined to include multiple blocks. An open TU can be an open block where some of the wordlines are not currently programmed, (e.g., in an erase state). Open TUs can remain open for a time limit (e.g., several hours) until they are closed (e.g., fully programmed). Since open TUs stay open for a certain period of time before getting closed, the cells on each wordline of an open TU can experience varying amounts of SCL. For instance, the older wordlines of the open TU (i.e., the wordlines that have been programmed the earliest) can have a large amount of SCL, whereas the younger wordlines of the open TU (i.e., the wordlines that have been programmed most recently) can have a smaller amount of SCL. This is due to the proportional relationship in memory cells affected by SCL between program-to-read operation elapsed time and the corresponding $V_T$ distribution shifts towards lower voltages. As older wordlines have a larger amount of elapsed time, the older wordlines experience larger amounts of SCL, while younger wordlines have a smaller amount of elapsed time and thus smaller amounts of SCL. These variations in SCL in an open TU can result in varying, non-uniform $V_T$ distribution shifts. As a result of these $V_T$ distribution shifts, it can be difficult to determine or predict an optimal read voltage level that can be applied to the wordlines of the open TU without compromising performance and data integrity.

In some memory sub-systems, a method for determining the read voltage level for the wordlines of an open TU that have mixed SCLs is to utilize a two-pass programming process. The first pass is a coarse programming phase, where the read voltage cell for each wordline is determined using the pass-through voltage $V_{pass}$, which raises the read voltage level rapidly to a higher read voltage level. The second pass is a fine programming phase, which raises the read voltage level in a slower manner to a slightly higher read voltage level. However, this method cannot accurately find distribution valleys for wordlines with a large amount of SCL. The two-pass programming process has a limited range, so although it raises the read voltage level to a higher read voltage level, the read voltage level can still be far away from the optimal read voltage level. This can lead to a higher error rate (i.e., RBER) and read retry rate during subsequent read operations.

Aspects of the present disclosure address the above and other deficiencies by having a memory sub-system that manages open TUs using an adaptive threshold voltage to mitigate performance and data integrity issues due to varying SCL amounts across wordlines. As discussed above, open TUs can have varying amounts of SCL across wordlines. In some embodiments of this invention, a memory sub-system can calculate threshold voltage offsets for least recently programmed wordlines and most recently programmed wordlines of an open TU. The memory sub-system can calculate the threshold voltage offsets based on the amount of $V_T$ distribution shifts for the least recently programmed wordlines and the most recently programmed. For example, the threshold voltage offset for each wordline can be a negative value that accounts for the shift in $V_T$ distribution for the wordline, thus mitigating the issues caused by the shift in $V_T$ distribution for each wordline. The threshold voltages can be adjusted based on the threshold voltage offsets calculated for each wordline.

In some embodiments of the present disclosure, a memory sub-system controller can perform a read operation on a set of memory cells connected to a wordline on an open TU. The memory sub-system controller can perform another read operation on another set of memory cells connected to another wordline on the open TU. In some embodiments, the memory sub-system controller performs the read operations once a certain period of time elapses between the read operations. In some embodiments, the two wordlines on which the read operations are performed can be the least recently programmed wordline and the most recently programmed wordline. After performing the read operations, the memory sub-system controller can identify a threshold voltage offset bin for the least recently programmed wordline and the most recently programmed wordline. Based on the threshold voltage offset bins for the least recently programmed wordline and the most recently programmed wordline, the memory sub-system controller can identify the threshold voltage offset bins for the other wordlines on the open TU. In some embodiments, the memory sub-system controller can identify the respective threshold voltage offset bins for the other wordlines by calculating the total number of threshold voltage offset bins for the open TU. The memory sub-system controller can then calculate the respective threshold voltage offset bins using an interpolation of the identified threshold voltage offset bins for the least recently programmed wordline, the most recently programmed wordline, and the total number of threshold voltage offset bins for the open TU. The memory sub-system controller can update, based on the respective threshold voltage offset bins for each wordline on the open TU, the respective default threshold voltages for each wordline on the open TU. In some embodiments, the memory sub-system controller can update the respective default threshold voltages for each wordline by adding the value representing each respective threshold voltage offset bin for each wordline to the value representing the respective default threshold voltage for each WL.

Advantages of the present disclosure include, but are not limited to improving data integrity and reducing read retry rates in open TUs on memory devices. In the embodiments described herein, the memory sub-system controller can offset threshold voltage distribution shifts due to SCL by adding a value representing the respective default threshold voltage for each wordline on an open TU to a value representing the respective threshold voltage offset bin for each wordline. The respective threshold offset bin is a negative value due to the distribution shift to lower voltages. Thus, adding the negative respective threshold offset bin value to the default threshold voltage value for a wordline will shift the threshold voltage to a more accurate and/or optimal value. As a result, when a subsequent read operation is performed on memory cells addressable by a wordline on the open TU, the updated and more accurate threshold voltage will be used. This leads to a lower error rate and improved reliability and data retention in the memory device. Accordingly, the overall performance of the memory sub-system is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an open TU management component 113 that manages open TUs using an adaptive read threshold voltage to mitigate mixed SCL. In some embodiments, the memory sub-system controller 115 includes at least a portion of the open TU management component 113. In some embodiments, the open TU management component 113 is part of the host system 110, an application, or an operating system. In other embodiments, local media controller 135 includes at least a portion of open TU management component 113 and is configured to perform the functionality described herein.

The open TU management component 113 can perform a read operation on a set of memory cells addressable by a wordline on an open TU. The open TU management component 113 can perform another read operation on another set of memory cells addressable by another wordline on the open TU. In some embodiments, the open TU management component 113 performs the read operations once a timer associated with the open TU satisfies a threshold criterion (e.g., a certain period of time elapses between subsequent read operations). In some embodiments, the two wordlines on which the read operations are performed can be the least recently programmed wordline and the most recently programmed wordline. After performing the read operations, the open TU management component 113 can identify a threshold voltage offset bin for the least recently programmed wordline and the most recently programmed wordline. The open TU management component 113 can determine, based on the identified threshold voltage offset bins for the least recently programmed wordline and the most recently programmed wordline, the respective threshold voltage offset bins for the other wordlines on the open TU. In some embodiments, the open TU management component 113 can determine the respective threshold voltage offset bins for the other wordlines by identifying the total number of threshold voltage offset bins for the open TU. The open TU management component 113 can then calculate the respective threshold voltage offset bins using an interpolation (e.g., a linear interpolation) of the identified threshold voltage offset bins for the least recently programmed wordline, the most recently programmed wordline, and the total number of threshold voltage offset bins for the open TU. The open TU management component 113 can update, based on the respective threshold voltage offset bins for each wordline on the open TU, the respective default threshold voltages for each wordline on the open TU. In some embodiments, the open TU management component 113 can update the respective default threshold voltages for each wordline by adding the value representing each respective threshold voltage offset bin for each wordline to the value representing the respective default threshold voltage for each WL. Further details with regards to the operations of the open TU management component 113 are described below.

Figure 2:
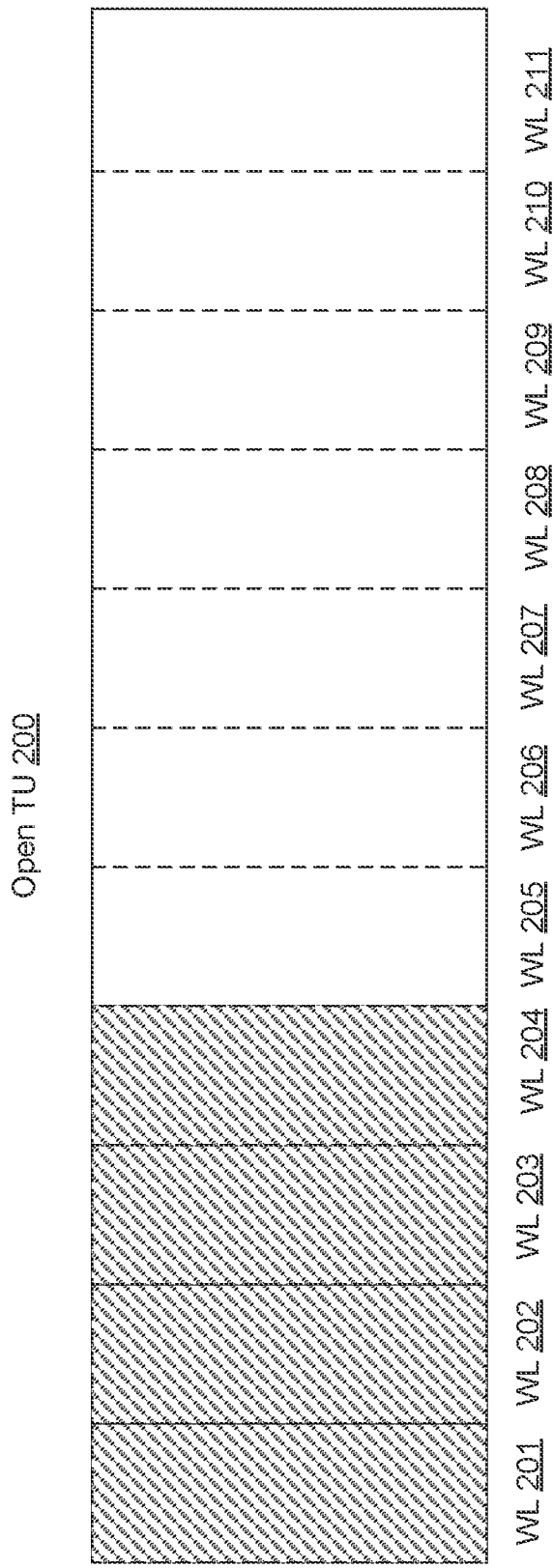
FIG. 2 is a diagram illustrating an example open translation unit in accordance with some embodiments of the present disclosure.

FIG. 2 is a diagram illustrating an example open TU 200, in accordance with some embodiments of the present disclosure. For example, the open TU 200 can be a NAND block. As shown, the open TU 200 includes a set of wordlines (WL), WL 201-WL 211. Each wordline can consist of a group of memory cells. The set of wordlines, WL 201-WL 211, includes a set of programmed WLs and a set of erased WLs. For example, WL 201 through WL 204 are programmed wordlines, where WL 201 corresponds to the least recently programmed WL, and WL 204 corresponds to the most recently programmed WL. The set of erased WLs include WL 205 through WL 211. As explained herein above, since WL 201 corresponds to the least recently programmed WL and WL 204 corresponds to the most recently programmed WL, WL 201 experiences a greater amount of SCL than WL 204.

Figure 3:
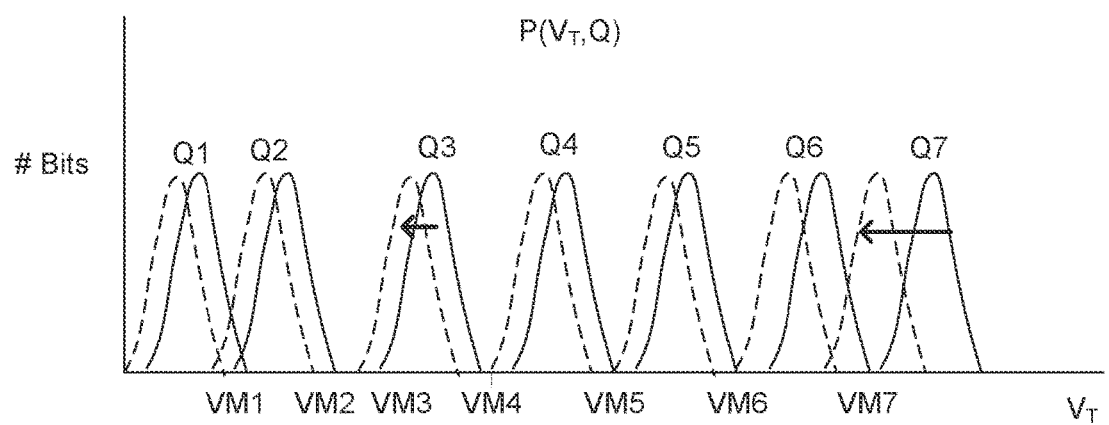
FIG. 3 is a diagram schematically illustrating mixed storage charge loss among wordlines of an open translation unit in accordance with some embodiments of the present disclosure.

FIG. 3 is a diagram schematically illustrating mixed storage charge loss among wordlines of an open TU, in accordance with some embodiments of the present disclosure. The threshold voltage distributions $P(V_T, Q_k)$ are separated with 7 valley margins $VM_n$. Q1 through Q7 represent a charge state. Memory cells programmed into a particular charge state $Q_k$ can store a particular combination of bits (e.g., 3 bits). Each set of memory cells can be on a separate wordline of the open TU. The charge state $Q_k$ can be determined during a read operation by detecting that a control gate voltage $V_{CG}$ within the valley margin $VM_k$ is sufficient to open a memory cell to the source-drain current whereas a control gate voltage within the preceding valley margin $VM_{k-1}$ is not, as explained in more details herein above. The distributions of threshold voltages depicted in solid lines are distributions that the memory cells have immediately after programming. With the passage of time, as a result of SCL, the distributions shift (typically, towards lower values of $V_T$), as shown by the shifted valleys indicated with dashed lines. In FIG. 3, a set of memory cells is in charge state Q7. The set of memory cells can be addressable by a least recently programmed wordline. As illustrated, there is a large shift in the threshold voltage distribution. FIG. 3 further illustrates a set of memory cells in charge state Q3. The set of memory cells can be addressable by a most recently programmed wordline. As shown, there is a smaller shift in the threshold voltage distribution in comparison to the shift for charge state Q7.

Figure 4:
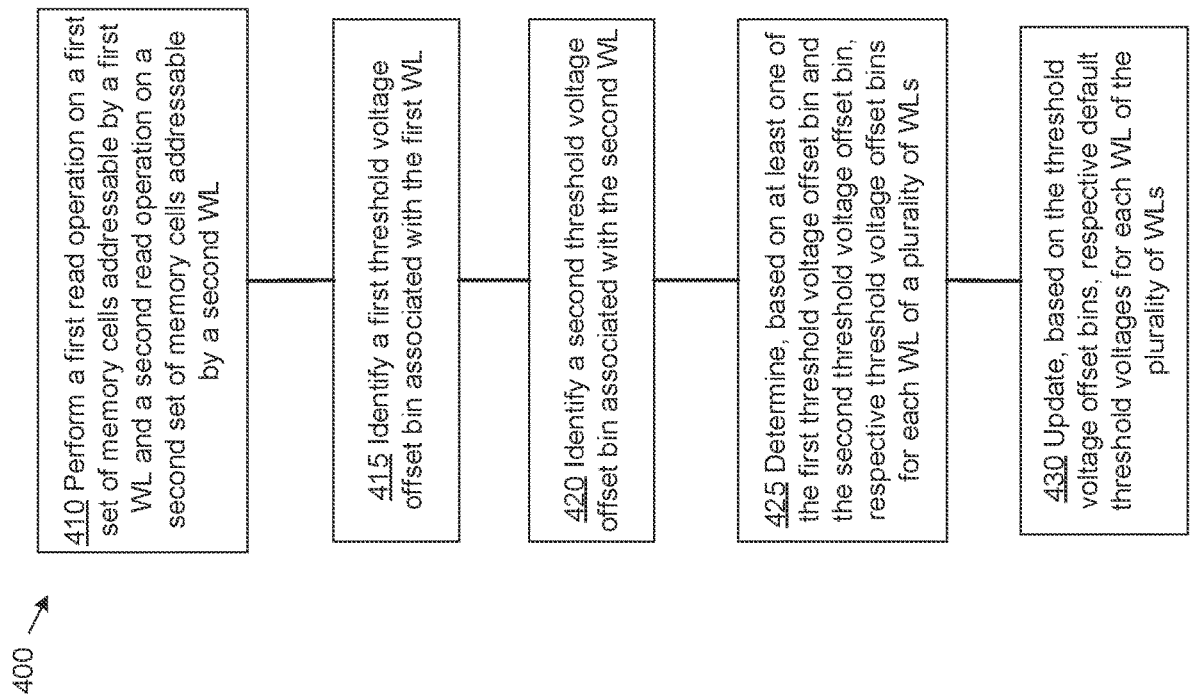
FIG. 4 is a flow diagram of an example method for open translation unit management using an adaptive read threshold in accordance with some embodiments of the present disclosure.

FIG. 4 is a flow diagram of an example method 400 for open TU management using an adaptive read threshold, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the open TU management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic performs a read operation on a set of memory cells addressable by a wordline (WL). The processing logic performs another read operation on another set of memory cells addressable by another WL. Each set of memory cells can be comprised by an open TU of memory cells on the memory device. In some embodiments, the WL and the other WL can be, respectively, the least recently programmed WL of the open TU and the most recently programmed WL of the open TU. In some embodiments, the read operations that are performed can be background read operations. For example, the background read operation can be part of a media scan operation. In some embodiments, the processing logic performs the read operations on each set of memory cells in response to determining that a timer satisfies a threshold criterion. In some embodiments, the processing logic can maintain a timer for the open TU. For example, the timer can measure a period of time that elapses between read operations performed on each set of memory cells comprised by the open TU. In some embodiments, determining that the timer satisfies the threshold criterion can include determining that a certain period of time (e.g., 1 hour) has elapsed between consecutive read operations performed on each set of memory cells. The certain period of time can be identified based on offline media testing and data characterization.

At operation 415, the processing logic identifies a threshold voltage offset bin associated with the WL. In some embodiments, identifying the threshold voltage offset bin associated with the WL can include identifying a default threshold voltage for the WL. Identifying the default threshold voltage for the WL can be based on metadata storing information about the default threshold voltage for the WL. The processing logic can further identify a threshold voltage distribution shift for the WL. The threshold voltage distribution shift can be due to an amount of SCL that has occurred on the WL. The processing logic can further determine the threshold voltage offset bin by calculating the difference in value between the default threshold voltage and the threshold voltage distribution shift for the WL. In some embodiments, the threshold voltage offset bin is a negative value.

At operation 420, the processing logic identifies another threshold voltage offset bin associated with the other WL. In some embodiments, identifying the other threshold voltage offset bin associated with the other WL can include identifying a default threshold voltage for the other WL. Identifying the default threshold voltage for the other WL can be based on metadata storing information about the default threshold voltage for the other WL. The processing logic can further identify a threshold voltage distribution shift for the other WL. The threshold voltage distribution shift can be due to an amount of SCL that has occurred on the other WL. The processing logic can further determine the threshold voltage offset bin by calculating the difference in value between the default threshold voltage and the threshold voltage distribution shift for the other WL. In some embodiments, the threshold voltage offset bin is a negative value.

At operation 425, the processing logic determines respective threshold voltage offset bins for each WL of a set of WLs. Each WL can be coupled to respective sets of memory cells comprised by the open TU. In some embodiments, each WL of the set of WLs can be a WL residing logically between the WL and the other WL described at operation 410. In some embodiments, determining the respective threshold voltage offset bins for each WL of the set of WLs can be based on at least one of the threshold voltage offset bins identified for the WL and the other WL at operations 415 and 420. In some embodiments, the processing logic can identify a total number of threshold voltage offset bins for the set of WLs of the open TU. For example, the processing logic can identify the total number of threshold voltage offset bins using metadata associated with the open TU, where the metadata includes information regarding the threshold voltage offset bins for the open TU. In some embodiments, the processing logic can further calculate the respective threshold voltage offset bins for each WL of the set of WLs based on interpolation. For example, the processing logic can use interpolation of certain data, including the threshold voltage offset bins for the WL and the other WL identified at operations 415 and 420 and the total number of threshold voltage offset bins, to calculate the respective threshold voltage offset bins for each WL of the set of WLs.

At operation 430, the processing logic updates respective default threshold voltages for each WL of the set of the WLs. In some embodiments, the processing logic updates the respective default threshold voltages based on the threshold voltage offset bins calculated at operation 425. For example, the processing logic can add the value representing each respective threshold offset bin for each WL to the value representing the respective default threshold voltage for each WL. In some embodiments, in response to a host and/or user-initiated read command to be performed on a set of memory cells of the open TU, the processing logic can perform the read operation using the updated respective default threshold voltages for the WL addressing the set of memory cells.

Figure 5:
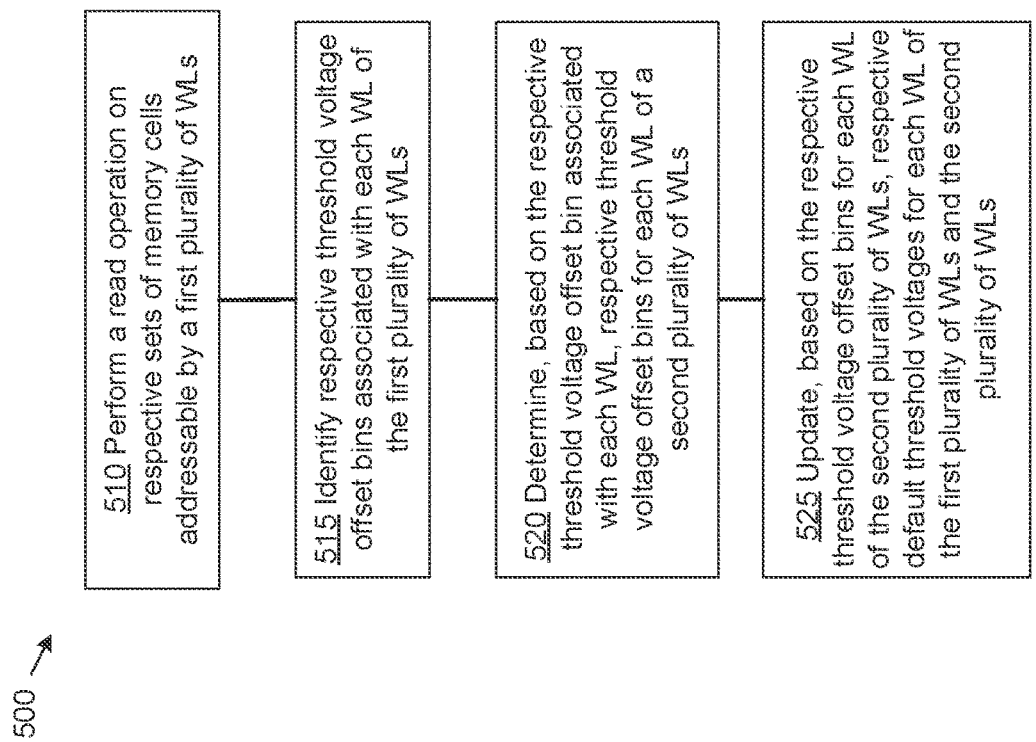
FIG. 5 is a flow diagram of an example method for open translation unit management using an adaptive read threshold in accordance with some embodiments of the present disclosure.

FIG. 5 is a flow diagram of an example method 500 for open TU management using an adaptive read threshold, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the open TU management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic performs a read operation on respective sets of memory cells addressable by a set of wordlines (WL). Each set of memory cells can be comprised by an open TU of memory cells on the memory device. In some embodiments, the set of WLs can include the least recently programmed WL of the open TU, the most recently programmed WL of the open TU, and one or more WLs residing logically between the least recently programmed WL and the most recently programmed WL. In some embodiments, the read operation performed can be a background read operation. For example, the background read operation can be part of a media scan operation. In some embodiments, the processing logic performs the read operation in response to determining that a timer satisfies a threshold criterion. In some embodiments, the processing logic can maintain a timer for the open TU. For example, the timer can measure a period of time that elapses between read operations performed on each set of memory cells comprised by the open TU. In some embodiments, determining that the timer satisfies the threshold criterion can include determining that a certain period of time (e.g., 1 hour) has elapsed between consecutive read operations performed on each set of memory cells. The certain period of time can be identified based on offline media testing and data characterization.

At operation 515, the processing logic identifies respective threshold voltage offset bins associated with each WL of the set of WLs. In some embodiments, identifying the respective threshold voltage offset bins associated with each WL can include identifying a respective default threshold voltage for each WL. Identifying the respective default threshold voltage for each WL can be based on metadata storing information about the respective default threshold voltage for each WL. The processing logic can further identify a respective threshold voltage distribution shift for each WL. The threshold voltage distribution shift can be due to an amount of SCL that has occurred on each WL. The processing logic can further determine the respective threshold voltage offset bins by calculating the difference in value between the respective default threshold voltage and the respective threshold voltage distribution shift for each WL. In some embodiments, the respective threshold voltage offset bins are each a negative value.

At operation 520, the processing logic determines respective threshold voltage offset bins for each WL of another set of WLs. Each WL of the other set of WLs can be coupled to respective sets of memory cells comprised by the open TU. In some embodiments, each WL of the set of WLs can be a WL residing logically between the least recently programmed WL and the most recently programmed WL, excluding the WLs of the set of WLs described at operation 510. In some embodiments, determining the respective threshold voltage offset bins for each WL of the other set of WLs can be based on the respective threshold voltage offset bins associated with each WL of the set of WLs described at operation 510. In some embodiments, the processing logic can identify a total number of threshold voltage offset bins for the open TU. For example, the processing logic can identify the total number of threshold voltage offset bins using metadata associated with the open TU, where the metadata includes information regarding the threshold voltage offset bins for the open TU. In some embodiments, the processing logic can further calculate the respective threshold voltage offset bin for each WL of the other set of WLs based on interpolation (e.g., linear interpolation). For example, the processing logic can use interpolation of certain data, including the respective threshold voltage offset bin for each WL of the set of WLs identified at operation 515 and the total number of threshold voltage offset bins, to calculate the respective threshold voltage offset bins for each WL of the other set of WLs.

At operation 525, the processing logic updates respective default threshold voltages for each WL of the set of the WLs described at operation 510 and each WL of the other set of WLs. In some embodiments, the processing logic updates the respective default threshold voltages based on the threshold voltage offset bins calculated at operation 520. For example, the processing logic can add the value representing each respective threshold offset bin for each WL of the set of WLs described at operation 510 to the value representing the respective default threshold voltage for each WL of the same set of WLs. In some embodiments, the processing logic can add the value representing each respective threshold offset bin for each WL of the other set of WLs to the value representing the respective default threshold voltage for each WL of the other set of WLs. In some embodiments, in response to a host and/or user-initiated read command to be performed on a set of memory cells of the open TU, the processing logic can perform the read operation using the updated respective default threshold voltages for the WL addressing the set of memory cells.

Figure 6:
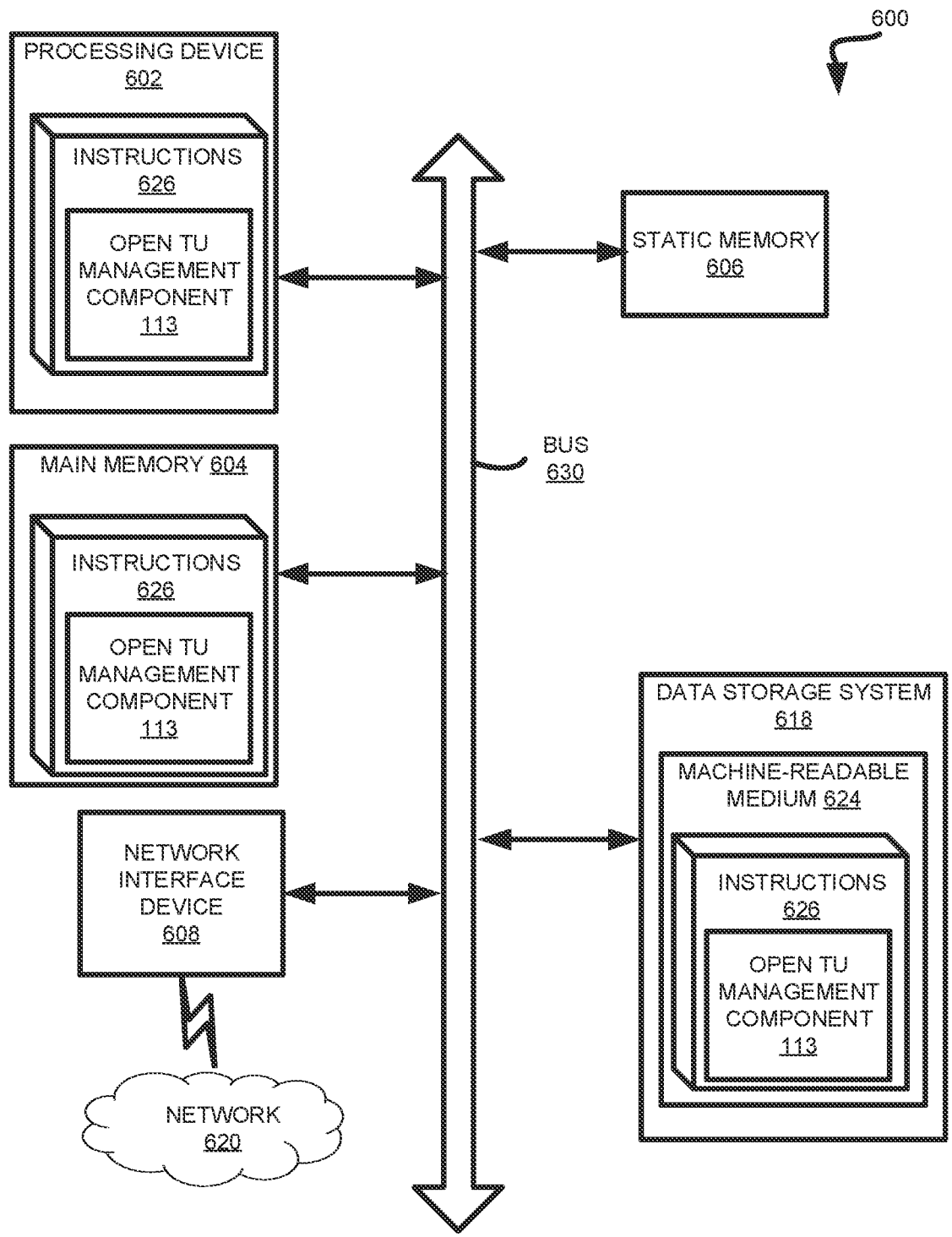
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the open TU management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an open TU management component (e.g., the open TU management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        performing a first read operation on a first set of memory cells addressable by a first wordline (WL) of a first plurality of WLs and a second read operation on a second set of memory cells addressable by a second WL of the first plurality of WLs, wherein the first set of memory cells and the second set of memory cells are comprised by an open translation unit (TU) of memory cells;
        identifying a first threshold voltage offset bin associated with the first WL;
        identifying a second threshold voltage offset bin associated with the second WL;
        determining, based on at least one of the first threshold voltage offset bin and the second threshold voltage offset bin, respective threshold voltage offset bins for each WL of a second plurality of WLs coupled to respective sets of memory cells comprised by the open TU; and
        updating, based on the respective threshold voltage offset bins for each WL of the second plurality of WLs, respective default threshold voltages for each WL of the first plurality of WLs and the second plurality of WLs.

2. The system of claim 1, further comprising:
    maintaining a timer associated with the open TU, wherein the timer is to measure a period of time elapsed between read operations performed on sets of memory cells comprised by the open TU;
    determining that the timer satisfies a threshold criterion; and
    in response to determining that the timer satisfies the threshold criterion, performing the first read operation on the first set of memory cells and the second read operation on the second set of memory cells.

3. The system of claim 1, wherein identifying the first threshold voltage offset bin associated with the first WL comprises:
    identifying a first default threshold voltage for the first WL;
    identifying a first threshold voltage distribution shift for the first WL; and
    determining the first threshold voltage offset bin based on the difference between the first default threshold voltage and the first threshold voltage distribution shift.

4. The system of claim 1, wherein determining, based on at least one of the first threshold voltage offset bin and the second threshold voltage offset bin, the respective threshold voltage offset bins for each WL of the second plurality of WLs comprises:
    determining a total number of threshold voltage offset bins associated with the first plurality of WLs coupled to respective sets of memory cells comprised by the open TU; and
    calculating the respective threshold voltage offset bins based on an interpolation of the first threshold voltage offset bin associated with the first WL, the second threshold voltage offset bin associated with the second WL, and the total number of threshold voltage offset bins.

5. The system of claim 1, wherein each WL of the plurality of WLs is a WL residing logically between the first WL and the second WL.

6. The system of claim 1, wherein the first WL is a least recently programmed WL of the open TU and the second WL is a most recently programmed WL of the open TU.

7. The system of claim 1, wherein updating, based on the threshold voltage offset bins, the respective default threshold voltages for each WL of the plurality of WLs comprises:
    adding a value representing each respective threshold voltage offset bin for each WL to a value representing the respective default threshold voltage for each WL.

8. The system of claim 1, wherein the first read operation and the second read operation are background operations.

9. A method comprising:
    performing a first read operation on a first set of memory cells of respective sets of memory cells addressable by a first wordline (WL) of a first plurality of WLs, wherein the respective sets of memory cells are comprised by an open TU of memory cells on a memory device;
    identifying respective threshold voltage offset bins associated with each WL of the first plurality of WLs;
    determining, based on the respective threshold voltage offset bin associated with each WL of the first plurality of WLs, respective threshold voltage offset bins for each WL of a second plurality of WLs coupled to respective sets of memory cells comprised by the open TU; and
    updating, based on the respective threshold voltage offset bins for each WL of the second plurality of WLs, respective default threshold voltages for each WL of the first plurality of WLs and the second plurality of WLs.

10. The method of claim 9, further comprising:
maintaining a timer associated with the open TU, wherein the timer is to measure a period of time elapsed between read operations performed on sets of memory cells comprised by the open TU;
determining that the timer satisfies a threshold criterion; and
in response to determining that the timer satisfies the threshold criterion, performing the read operation on the respective sets of memory cells.

11. The method of claim 9, wherein identifying the respective threshold voltage offset bins associated with each WL of the first plurality of WLs comprises:
identifying a respective default threshold voltage for each WL of the first plurality of WLs;
identifying a respective threshold voltage distribution shift for each WL of the first plurality of WLs;
determining a difference between the respective default threshold voltage and the respective threshold voltage distribution shift for each WL; and
determining the respective threshold voltage offset bins associated with each WL based on the difference between the respective default threshold voltage and the respective threshold voltage distribution shift for each WL.

12. The method of claim 9, wherein determining, based on the respective threshold voltage offset bin associated with each WL of the first plurality of WLs, respective threshold voltage offset bins for each WL of the second plurality of WLs comprises:
determining a total number of threshold voltage offset bins associated with the open TU; and
calculating the respective threshold voltage offset bin based on an interpolation of the respective threshold voltage offset bin associated with each WL of the first plurality of WLs and the total number of threshold voltage offset bins.

13. The method of claim 9, wherein the first plurality of WLs comprises a first WL, a second WL, and a WL residing logically between the first WL and the second WL.

14. The method of claim 9, wherein the first WL is a least recently programmed WL of the open TU and the second WL is a most recently programmed WL of the open TU.

15. The method of claim 9, wherein updating, based on the respective threshold voltage offset bins for each WL of the second plurality of WLs, the respective default threshold voltages for each WL of the first plurality of WLs and the second plurality of WLs comprises:
adding a value representing each respective threshold voltage offset bin for each WL of the first plurality of WLs to a value representing the respective default threshold voltages for each WL of the first plurality of WLs; and
adding a value representing each respective threshold voltage offset bin for each WL of the second plurality of WLs to a value representing the respective default threshold voltages for each WL of the second plurality of WLs.

16. A non-transitory computer-readable storage medium comprising instructions that, when executed by a processing device, cause the processing device to perform operations comprising:
performing a first read operation on a first set of memory cells addressable by a first wordline (WL) of a first plurality of WLs and a second read operation on a second set of memory cells addressable by a second WL of the first plurality of WLs, wherein the first set of memory cells and the second set of memory cells are comprised by an open TU of memory cells of a memory device;
identifying a first threshold voltage offset bin associated with the first WL;
identifying a second threshold voltage offset bin associated with the second WL;
determining, based on at least one of the first threshold voltage offset bin and the second threshold voltage offset bin, respective threshold voltage offset bins for each WL of a second plurality of WLs coupled to respective sets of memory cells comprised by the open TU; and
updating, based on the respective threshold voltage offset bins for each WL of the second plurality of WLs, respective default threshold voltages for each WL of the first plurality of WLs and the second plurality of WLs.

17. The non-transitory computer-readable storage medium of claim 16, wherein the processing device is to perform operations further comprising:
maintaining a timer associated with the open TU, wherein the timer is to measure a period of time elapsed between read operations performed on sets of memory cells comprised by the open TU;
determining that the timer satisfies a threshold criterion; and
in response to determining that the timer satisfies the threshold criterion, performing the first read operation on the first set of memory cells and the second read operation on the second set of memory cells.

18. The non-transitory computer-readable storage medium of claim 16, wherein identifying the first threshold voltage offset bin associated with the first WL comprises:
identifying a first default threshold voltage for the first WL;
identifying a first threshold voltage distribution shift for the first WL; and
determining the first threshold voltage offset bin based on the difference between the first default threshold voltage and the first threshold voltage distribution shift.

19. The non-transitory computer-readable storage medium of claim 16, wherein determining, based on at least one of the first threshold voltage offset bin and the second threshold voltage offset bin, the respective threshold voltage offset bins for each WL of the second plurality of WLs comprises:
determining a total number of threshold voltage offset bins associated with the first plurality of WLs coupled to respective sets of memory cells comprised by the open TU; and
calculating the respective threshold voltage offset bins based on an interpolation of the first threshold voltage offset bin associated with the first WL, the second threshold voltage offset bin associated with the second WL, and the total number of threshold voltage offset bins.

20. The non-transitory computer-readable storage medium of claim 16, wherein updating, based on the respective threshold voltage offset bins for each WL of the second plurality of WLs, the respective default threshold voltages for each WL of the second plurality of WLs comprises:
adding a value representing each respective threshold voltage offset bin for each WL to a value representing the respective default threshold voltage for each WL.

* * * * *